United States Patent
Casper et al.

[19]

[11] Patent Number: 5,880,917
[45] Date of Patent: Mar. 9, 1999

[54] WELL RESISTOR FOR ESD PROTECTION OF CMOS CIRCUITS

[75] Inventors: Stephen L. Casper; Manny K. F. Ma; Joseph C. Sher, all of Boise, Id.

[73] Assignee: Micron Technology, Inc., Boise, Id.

[21] Appl. No.: 906,174

[22] Filed: Aug. 4, 1997

Related U.S. Application Data

[63] Continuation of Ser. No. 515,921, Aug. 16, 1995, Pat. No. 5,654,860.

[51] Int. Cl.⁶ .................................................. H02H 9/00
[52] U.S. Cl. ................... 361/56; 361/58; 361/111
[58] Field of Search ................. 361/56, 111, 91, 361/117, 118, 119, 127, 58

[56] References Cited

U.S. PATENT DOCUMENTS

| | | | |
|---|---|---|---|
| 4,822,749 | 4/1989 | Flanner et al. | 437/41 |
| 4,977,537 | 12/1990 | Dias et al. | 364/900 |
| 5,051,860 | 9/1991 | Lee et al. | 361/58 |
| 5,148,056 | 9/1992 | Glass et al. | 307/443 |
| 5,227,327 | 7/1993 | Sasaki | 437/60 |
| 5,274,276 | 12/1993 | Casper et al. | 307/443 |
| 5,304,502 | 4/1994 | Hanagasaki | 437/41 |
| 5,440,163 | 8/1995 | Ohhashi | 257/355 |
| 5,654,860 | 8/1997 | Casper et al. | 361/91 |

FOREIGN PATENT DOCUMENTS

| | | | |
|---|---|---|---|
| 2281813 | 3/1995 | United Kingdom | H02H 3/20 |

OTHER PUBLICATIONS

Winnerl, J., "Silicides for High–Density Memory and Logic Circuits", *Semiconductor International*, (4 pages) (Aug. 1994).

Primary Examiner—Jeffrey Gaffin
Assistant Examiner—Stephen Jackson
Attorney, Agent, or Firm—Schwegman, Lundberg, Woessner & Kluth, P.A.

[57] ABSTRACT

A circuit for providing electrostatic discharge (ESD) protection is disclosed. The circuit comprises a pair of CMOS field effect pull up and pull down transistors with reduced resistance source and drain, having a well resistor formed external to them between supply and ground busses respectively. During an ESD event, the well resistors serve to both limit the current flow through the transistors, and reduce the voltage drop across them.

28 Claims, 1 Drawing Sheet

… …

WELL RESISTOR FOR ESD PROTECTION OF CMOS CIRCUITS

"This application is a continuation of U.S. patent application Ser. No. 08/515,921, filed Aug. 16, 1995" now U.S Pat. No. 5,654,860.

FIELD OF THE INVENTION

The present invention relates to apparatus for protecting CMOS transistors from electro static discharge, and in particular the use of external well resistors to provide such protection.

BACKGROUND OF THE INVENTION

In conventional CMOS processes, built-in resistors from the active areas of a transistor protect the pull-up and pull-down devices by absorbing a portion of voltage drops, and also serve to limit the total amount of current that is allowed to flow through the devices during electrostatic discharge (ESD) events. However, in processes where the resistance of the active areas is small, or is reduced to improve the frequency response of CMOS circuitry, the active area resistance no longer functions to provide such a current limiting effect. A need exists to provide for limiting the current through active devices during ESD events without adversely affecting the speed at which such devices operate.

SUMMARY OF THE INVENTION

The present invention provides a method and apparatus for limiting the amount of current flowing through active devices during an ESD event. Well resistors are coupled in series with the pull-up and pull-down transistor pair and the power supply and ground respectively to limit such current. A first well resistor is connected between Vcc power supply line and the pull up transistor to limit current flow to the output when the ESD event strikes the Vcc supply line. A second well resistor is connected between a Vss ground line the pull down transistor to limit current flow to the output when the ESD event strikes the Vss ground line. The well resistors do not substantially adversely affect the switching speeds of the transistors because they are formed external to the transistors.

In one preferred embodiment, the externally formed well resistors are coupled in series with the pull-up and pull-down devices of a CMOS output driver. The first resistor increases the overall resistance and thereby reduces current flow between the Vcc power supply to the output. The second resistor increases the overall resistance and thereby reduces potential current flow between the Vss ground to the output. Both resistors also provide a large voltage drop during high currents, limiting voltage applied across the transistors. Thus the impact of ESD events occurring on either Vss or Vcc to the devices is limited.

In further embodiments, only one of the pull-up and pull-down devices is protected by an externally formed well resistor depending on which of the Vss or Vcc busses are most likely to be associated with an ESD event. When space on a semiconductor die is limited, protecting only the active areas most likely to be affected by an ESD event provides a designer the ability to provide increased reliability while maintaining high circuit densities.

DESCRIPTION OF THE PREFERRED EMBODIMENT

In the following detailed description of the preferred embodiment, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and the structural, logical present inventions. The following detailed description is, therefore, not to be taken in a limiting sense, and the scope of the present invention is defined only by the appended claims.

Numbering in the figures is usually done with the hundreds and thousands digits corresponding to the figure number, with the exception that the same components may appear in multiple figures. Signals and connections may be referred to by the same number or label, and the actual meaning should be clear from the context of use.

Figure 1:
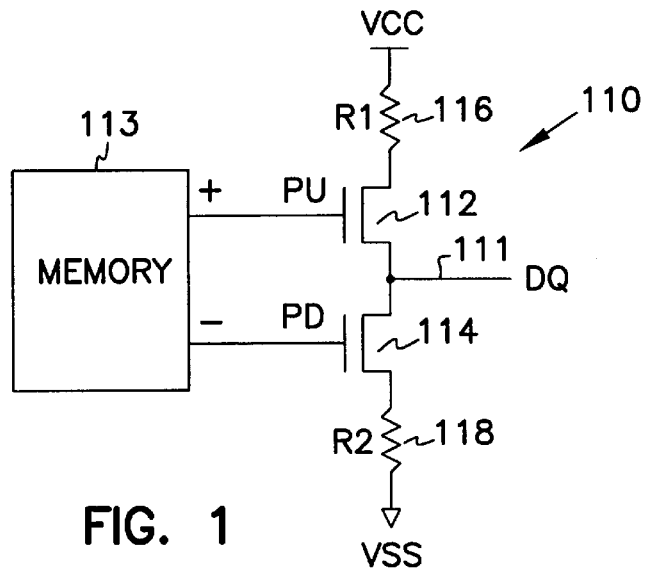
FIG. 1 is a circuit diagram indicating the electrical connections of the N-well resistors of the present invention.

In FIG. 1, an output driver shown generally at 110 provides an output, DQ shown at 111, for circuitry contained on a standard semiconductor die. A pull-up (PU) CMOS enhancement mode insulated gate field effect n channel transistor is shown at 112 with it's complimentary pull-down (PD) n channel transistor indicated at 114. The source of transistor 112 is coupled to the drain of transistor 114. The drain of pull-up transistor 112 is coupled through a first N-well resistor R1 indicated at 116 to power supply voltage Vcc. The source of pull-down transistor 114 is coupled through a second N-well resistor R2 indicated at 118 to ground voltage Vss. Thus, each transistor is coupled in series with a N-well resistor to respective busses on which an ESD event is most likely to occur. The N-well resistors serve to limit the current through the channels of the transistors during such an event to reduce the chances of any damage occurring to the transistors. Also, higher currents will result in higher voltages across the N-well resistors, serving to limit the amount of voltage applied to the transistors, during an ESD event.

The gate of transistors 112 is coupled to a signal originating from a bit or word line of a dynamic random access memory (DRAM) 113 which is formed on the same substrate as the transistor pair. The complement of the DRAM signal is provided to the gate of transistor 114. The source of the pull up transistor 112 and drain of the pull down transistor 114 are coupled to provide a fast switching high impedance output DQ. The pair serve as a CMOS output driver for providing signals which are coupled to a separate device, such as a bus driver for providing signals which are coupled to a separate device, such as a bus in a personal computer, or a connector in a circuit card. It should be noted that in many field effect transistors, the source and drain are essentially interchangeable, and interconnections specified herein should not be interpreted as solely limited to those described. In addition, in many cases, the doping of semiconductor structures may be reversed on a wholesale basis to obtain similar functions.

Figure 2:
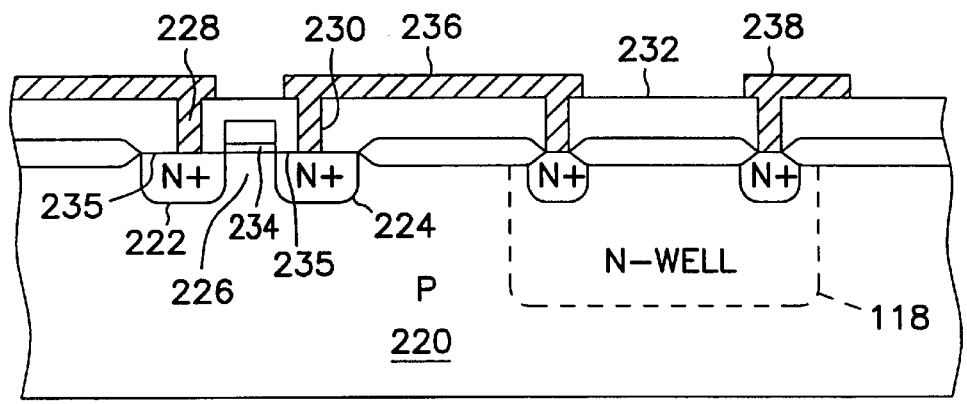
FIG. 2 is a simplified cross section view of a substrate having a portion of the circuit of FIG. 1 formed therein.

A cross section of one of the transistor and resistor pair is shown in FIG. 2. A P type substrate 220 is used to form transistor 114. Active areas 222 and 224 are formed with N+ doping to form the source and drain respectively. This type of field effect transistor is called an N-channel device. Metal contacts 228, and 230 are formed through an insulating layer 232 to provide electrical contact for the source and drain respectively. A metal contact, not visible in this cross section, is formed over a gate dielectric 234 to provide electrical contact for the gate. In addition, in one preferred embodiment, silicide, preferably formed of a metal strapped polysilicon material, with tungsten (TuSi2), titanium (TiSi2) or other suitable metal, is applied to the surface of the active N+ areas 222 and 224 as shown at 235 to decrease their resistance, thereby increasing the switching speed of transistor 114. The sheet resistance of the silicide is preferably around 6 ohms per square but may vary with different materials and concentrations. In many prior transistors, the active area resistance served to limit the current through the transistor during an ESD event. Since the resistance of the active areas is now decreased, they no longer serve well for that function.

The N-well resistor, shown at 118 and formed external to the transistor 114 now serves the function of limiting current through the transistor during an ESD event. In one embodiment, the active area drain 230 is coupled by a conductive metal, polysilicon or other conductive layer 236 to the N-well resistor 118, via an N+ region, which is then connected by a further N+ region to a conductive layer 238 to Vss. In another embodiment, the source, 230 is coupled by conductive layer 236 to the N-well resistor 118, which is then connected by conductive layer 238 to the output DQ. Thus, the N-well resistors may be placed on either side of the transistors 112 and 114, so long as they provide a series connection with the transistor to limit current during an ESD event.

Because the N-well resistor is formed external to the transistor 114, it has no direct affect on the switching speed of the transistor itself. It is also, not a critical device that must have closely controlled characteristics. Thus, it may be formed on the edges of the die containing circuitry for which the output driver 110 provides output DQ which is available for connection to other die or devices. Since the edges of a die or chip are subject to the most stress and potential defects due to cutting of the die and misalignment of processes, circuitry is not normally placed in such areas. Thus, the real estate used to form the N-well is not normally used for circuitry, so the number of usable circuits obtainable on the die is not reduced.

In a further embodiment, only one of pull up transistor 112 and pull down transistor 114 is protected by an externally formed well resistor depending on which of the Vss or Vcc busses are most likely to be associated with an ESD event. When space on a semiconductor die is limited, protecting only the active areas most likely to be affected by an ESD event provides a designer the ability to provide increased reliability while maintaining high circuit densities.

Figure 3:
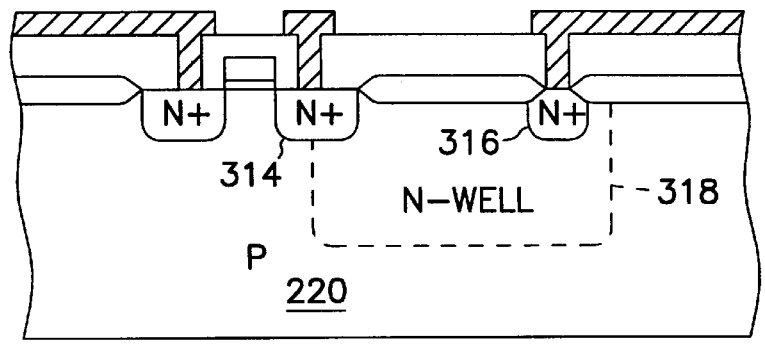
FIG. 3 is a simplified cross section view of a substrate showing an alternative arrangement of the N-well resistors of FIG. 1.

In FIG. 3, an alternative position for an N-well resistor 318 is shown. The N-well resistor 318 is now formed partially overlapping an active area source or drain 314, allowing the active area to provide the dual function of both serving as a source or drain for a transistor, and to serve as a first contact area for N-well resistor 318. A second contact area 316 formed at a far end of the N-well area 318 is coupled to a metalized area, which as in the embodiment of figure two is coupled to either a supply voltage, or the output. This alternative embodiment saves space on the die, allowing room for further circuitry.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method for protecting a CMOS circuit formed on a single crystal semiconductor die having memory circuits formed thereon from electrostatic discharge, said method comprising:

forming a pull up, N channel, field effect transistor having a gate for receiving an input signal, and a source and a drain in said die;

forming a pull down, N channel, field effect transistor having a gate for receiving the complement of the input signal, and a source and a drain in said die;

forming a first N-well resistor formed external to the transistors and coupled in series with the pull up transistor and a power supply line;

forming a second N-well resistor formed external to the transistors and coupled in series with the pull down transistor and a ground line; and forming an output line coupled between the pull up and pull down transistors for providing an output signal representative of the input signal.

2. The circuit of claim 1 further comprising providing the input signal from memory circuits on the same die.

3. The method of claim 2 wherein the memory circuits are dynamic random access memory circuits.

4. The method of claim 1 wherein the sources and drains are formed of N+ doped silicon.

5. The circuit of claim 4 wherein the N-well resistor partially overlaps one of the N+ doped silicon source or drain so that the source or drain serves as a contact for one end of the resistor.

6. The circuit of claim 4, further comprising covering the source and drains with a conductive material to reduce their resistance and thereby increase the switching speed of the transistors.

7. The method of claim 6 wherein the conductive material is a silicide.

8. The method of claim 6 wherein the conductive material is tungsten silicide.

9. A method for protecting an integrated circuit from electrostatic discharge, comprising the steps of:

forming a pull up transistor having a gate for receiving an input signal, and a source and a drain in the integrated circuit;

forming a pull down transistor having a gate for receiving the complement of the input signal, and a source and a drain in the integrated circuit;

forming a first resistor formed external to the transistors and coupled in series with the pull up transistor and a power supply line in the circuit;

forming a second resistor formed external to the transistors and coupled in series with the pull down transistor and a ground line in the circuit; and coupling an output line between the pull up and pull down transistors for providing an output signal representative of the input signal.

10. The method of claim 9, further comprising covering the source and drains with a conductive material to reduce their resistance and thereby increase the switching speed of the transistors.

11. The method of claim 9 wherein the sources and drains are formed of N+ doped silicon.

12. The method of claim 11 wherein the conductive material is a silicide.

13. The method of claim 11 wherein the conductive material is tungsten silicide.

14. The method of claim 11 wherein the N-well resistor partially overlaps one of the N+ doped silicon source or drain so that the source or drain serves as a contact for one end of the resistor.

15. A method for protecting from electrostatic discharge a CMOS circuit on a single crystal semiconductor die having DRAM memory circuits formed therein, said method comprising:
   receiving an input signal from the memory circuit at a gate of a pull up, N channel, field effect transistor having a source and a drain;
   receiving the complement of the input signal at a gate of a pull down, N channel, field effect transistor having a source and a drain;
   coupling a first N-well resistor external to the transistors between a power supply line and the drain of the pull up transistor;
   coupling a second N-well resistor external to the transistors between a ground line and the source of the pull down transistor; and
   transmitting an output signal representative of the input signal to an output line coupled between the source of the pull up transistor and the drain of the pull down transistor.

16. A method for protecting an integrated circuit from electrostatic discharge, comprising:
   receiving an input signal at a gate of a pull up transistor having a source and a drain;
   receiving the complement of the input signal at a gate of a pull down transistor having a source and a drain, said pull up and pull down transistors being coupled in series between a power supply line and a ground line;
   coupling a first resistor external to the transistors in series between the transistors;
   coupling a second resistor external to the transistors in series with the first resistor between the transistors; and
   transmitting an output signal representative of the input signal to an output line coupled between the first and second resistors.

17. The method of claim 16 wherein the sources and drains are formed N+ doped silicon.

18. The method of claim 17 wherein the N-well resistor partially overlaps one of the N+ doped silicon source or drain so that the source or drain serves as a contact for one end of the resistor.

19. The method of claim 17 further comprising covering the source and drains with a conductive material to reduce their resistance and thereby increase the switching speed of the transistors.

20. The method of claim 19 wherein the conductive material is a silicide.

21. The method of claim 19 wherein the conductive material is tungsten silicide.

22. A method for providing an electrostatic discharge path between a power supply line and a ground line in an integrated circuit, comprising:
   forming a pull up transistor having a gate for receiving an input signal, and a source and a drain in the circuit;
   forming a pull down transistor having a gate for receiving the complement of the input signal, and a source and a drain in the circuit;
   coupling an output line between the pull up transistor and the pull down transistor;
   forming a first resistor external to the transistors and coupled in series with the pull up transistor between the power supply and the output line; and
   forming a second resistor external to the transistors and coupled in series with the pull down transistors between the ground line and the output line.

23. A method for providing an electrostatic discharge path in a circuit, comprising:
   forming a pull up transistor having a gate for receiving an input signal, and a source and a drain in the circuit;
   forming a pull down transistor having a gate for receiving the complement of the input signal, and a source and a drain in the circuit;
   coupling an output line between the pull up and pull down transistors for providing an output signal representatives of the input signal; and
   including at least one of—
      a first resistor external to the transistors and coupled in series with the pull up transistor and a power supply line, and
      a second resistor external to the transistors and coupled in series with the pull down transistors and a ground line.

24. The method of claim 23 wherein the sources and drains are formed of N+ doped silicon.

25. The method of claim 24, further comprising covering the source and drains with a conductive material to reduce their resistance and thereby increase the switching speed of the transistors.

26. The method of claim 24 wherein the conductive material is a silicide.

27. The method of claim 24 wherein the conductive material is tungsten silicide.

28. The method of claim 24 wherein the N-well resistor partially overlaps one of the N+ doped silicon source or drain so that the source or drain serves as a contact for one end of the resistor.

* * * * *

UNITED STATES PATENT AND TRADEMARK OFFICE
CERTIFICATE OF CORRECTION

PATENT NO. : 5,880,917
DATED : Mar. 9, 1999
INVENTOR(S) : Stephen L. Casper, et al.

It is certified that error appears in the above-identified patent and that said Letters Patent is hereby corrected as shown below:

At Col. 5, line 47, please insert --of-- following "formed".

At Col. 3, line 43, please delete "N-well" and insert --N-wells--.

At Col. 6, line 20, please delete "transistors" and insert --transistor--.

At Col. 6, line 38, please delete "transistors" and insert --transistor--.

Signed and Sealed this

Sixteenth Day of November, 1999

Attest:

Q. TODD DICKINSON

*Attesting Officer*    *Acting Commissioner of Patents and Trademarks*